United States Patent [19]

Ohshima et al.

[11] Patent Number: 5,233,564
[45] Date of Patent: Aug. 3, 1993

[54] MULTIPORT MEMORY WITH TEST SIGNAL GENERATING CIRCUIT CONTROLLING DATA TRANSFER FROM RAM PORT TO SAM PORT

[75] Inventors: Shigeo Ohshima, Yokohama; Tatsuo Ikawa, Mitaka, both of Japan

[73] Assignee: Kabushiki Kaisha Toshiba, Kawasaki, Japan

[21] Appl. No.: 712,701

[22] Filed: Jun. 10, 1991

[30] Foreign Application Priority Data

Jun. 8, 1990 [JP] Japan .................. 2-151328
Aug. 31, 1990 [JP] Japan .................. 2-230178

[51] Int. Cl.$^5$ ................................. G11C 7/00
[52] U.S. Cl. ........................ 365/230.05; 365/201
[58] Field of Search ................... 365/201, 230.05

[56] References Cited

U.S. PATENT DOCUMENTS 4,731,760  3/1988  Maini .......................... 365/201
4,833,652  5/1989  Isobe et al. ................... 365/201
5,109,359  4/1992  Sakakibara et al. ............. 365/201

FOREIGN PATENT DOCUMENTS 4027051  4/1991  Fed. Rep. of Germany .
62279596 5/1988  Japan .

*Primary Examiner*—John S. Heyman
*Attorney, Agent, or Firm*—Foley & Lardner

[57] ABSTRACT

The disclosed semiconductor memory comprises a random access memory port, a serial access memory port, a data transfer gate formed between the two ports, and in particular a test signal generating circuit for generating a test signal to the data transfer gate to close the gate so that data stored in the serial access memory port can be read to outside, without transferring data from the random access memory port to the serial access memory port. Therefore, it is possible to discriminate an erroneous operation caused when data are read from the serial access memory port from that caused when data are transferred from the random access memory port to the serial access memory port.

5 Claims, 3 Drawing Sheets

FIG.4

| CAS | | | | | | | | |
|---|---|---|---|---|---|---|---|---|
| RAS | | | | 0 | 0 | 1 | 1 | |
| CAS | | | | 0 | 0 | 0 | 0 | |
| DT/DE | WB/WE | SE | DSF | DSF | | | (1) | (2) |
| 0 | 0 | * | | | CAS BEFORE RAS REFLESH CYCLE | | — | — |
| 0 | 1 | * | | | | | 0 | — |
| — | 0 | * | | | | | — | — |
| — | 1 | * | | | | | | |
| 0 | 0 | 0 | | | WRITE TRANS(MASK) | SPRIT | WRITE TRANS (MASK) | SPRIT |
| 0 | 0 | 1 | | | PSEUDO-WRITE TRANS | WRITE TRANS (MASK) | PSEUDO-WRITE TRANS | WRITE TRANS (MASK) |
| — | 0 | * | | | READ TRANS | SPLIT READ TRANS | READ TRANS | SPLIT READ TRANS |
| 0 | 1 | * | | | WRITE PER BIT CYCLE | FLASH WRITE CYCLE | BLOCK WRITE (MASK) | FLASH WRITE |
| — | 1 | * | | | READ/WRITE CYCLE | LOAD TO COLOR REG. | BLOCK WRITE | LOAD TO COLOR REG. |

MULTIPORT MEMORY WITH TEST SIGNAL GENERATING CIRCUIT CONTROLLING DATA TRANSFER FROM RAM PORT TO SAM PORT

BACKGROUND OF THE INVENTION

The present invention relates to a semiconductor memory, and more specifically to a multiport memory provided with a RAM (random access memory) port and a SAM (serial access memory) port.

FIG. 6 shows an essential portion of a prior art multiport memory, which is composed of a RAM port cell array 53 in which dynamic type memory cells are arranged in matrix form; a SAM port data register 51 composed of serial data registers arranged in the column direction and connected to a row wire of the RAM port cell array 53, respectively; and a data transfer gate 52 for transferring data between the RAM port cell array 53 and the SAM port data register 51 in response to a data transfer control signal TRG.

In the multiport memory provided with the RAM port and the SAM port on the same chip as described above, since high speed data access from the SAM port and another access from a CPU to the RAM port without synchronism with the high speed data access are both enabled, a wide application is being expected as image memory, for instance.

In contrast with these excellent performance, however, since the multiport memory is provided with not only all the functions as general purpose dynamic memory but also other special functions, the evaluation and failure analysis of the products are extremely complicated and diversified, thus raising a problem or difficulty when the multiport memory is practically manufactured.

Furthermore, the operational failure analysis related to data transfer between the RAM port and the SAM port is particularly important and complicated in various failure analyses related to the multiport memory. In particular, in the read transfer mode in which data are transferred from the RAM port to the SAM port, it is necessary to switch the operation mode of the SAM port from write cycle mode (serial in) to read cycle mode (serial out), and simultaneously to transfer data stored in any given one-row memory cells of the RAM port to a SAM port data register and further to read a head address (referred to as a TAP address) required to read the data in serial from the RAM port. Since these operations are effected continuously, the analysis to ascertain whether operational failure occurs in the mode switching operation or the data transfer operation becomes extremely complicated.

To explain an example of failure analysis, the SAM port operation in the prior art memory will be described hereinbelow with reference to FIG. 7. The serial data registers of the SAM port register 51 are connected to a data line pair SDQn and $\overline{SDQn}$, respectively; and these data line pairs SDQn and $\overline{SDQn}$ are all connected to a serial input buffer 62. The serial input buffer 62 is provided with a serial input/output terminal SIOn. A serial input control circuit 61 to which a serial clock SC and a serial enable signal $\overline{SE}$ are inputted is connected to this serial input buffer 62.

When a serial enable signal $\overline{SE}$ is inputted to the serial input control circuit 61, since the serial input buffer 62 is activated, serial data are inputted therein or outputted therefrom through the serial data input/output terminal SIOn on the basis of timing of the serial clock SC.

Here, where data in the SAM port are read to outside, first it is necessary to switch the operation mode of the SAM port from the write cycle mode to the read cycle mode. In this switching operation, however, since data must be transferred from the RAM port to the SAM port, this switching operation ends after the data transfer operation has been completed. Therefore, data stored in the SAM port cannot be read to outside before the operation mode has been switched, and additionally data stored in the data register 51 before the mode is switched are destructed by this data transfer. Therefore, data stored in the RAM port cell array 53 must be once transferred to the SAM port data register 51, and these transferred data must be read. Here, in case the read data are erroneous, it has been extremely difficult to conduct failure analysis by separating the problem caused when data are transferred to the SAM port from that caused when the transferred data are read to outside.

As described above, in the prior-art multiport memory, there exist problems in that the operational failure in the read transfer mode is difficult to analyze; it takes much time to identify the defective location; a long turnaround time (TAT) is required to refine the memory into practical products where the operational failure is overlooked.

SUMMARY OF THE INVENTION

With these problems in mind, therefore, it is the object of the present invention to provide a semiconductor memory which can quickly identify failure location and efficiently analyze operational failure.

According to the present invention, there is provided a semiconductor memory, comprising: a random access memory port composed of memory cells arranged on a semiconductor chip in matrix fashion; a serial access memory port composed of serial data registers arranged on the same semiconductor chip in a column direction of the random access memory port; a data transfer gate provided between the random access memory port and the serial access memory port; and test signal generating means for generating a test signal to the data transfer gate to close the gate, when data stored in the serial access memory port are read to outside, whereby the data stored in the serial access memory port can be read to outside, without transferring data from the random access memory port to the serial access memory port.

In the memory according to the present invention, when data stored in the serial access memory port are read to outside, since a test signal is given from the test signal generating means to the transfer gate to close the gate, data will not be transferred from the random access memory port to the serial access memory port. Therefore, in case the data read to the outside are erroneous, it is possible to discriminate an erroneous operation caused when data are read from the serial access memory port from an erroneous operation caused when data are transferred from the random access memory port to the serial access memory port.

The timing at which the test signal is generated by the test signal generating means can be determined when an external predetermined potential is supplied to a lead and then to the test signal generating means via an electrode connected to the lead, or when a specific combination of plural signal levels not defined as the ordinary operation modes is applied from among a plurality of signal level combinations defining various operation modes.

BRIEF DESCRIPTION OF THE DRAWINGS

In the attached drawings,

FIG. 4 is a table showing combinations of operation truth values prescribed by JEDEC;

DESCRIPTION OF THE PREFERRED EMBODIMENTS

Figure 1:
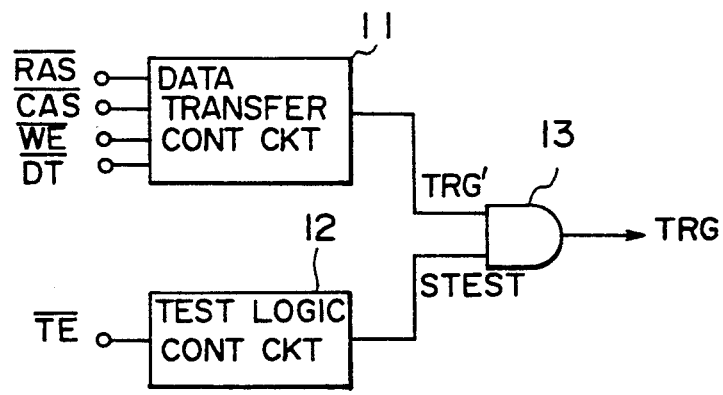
FIG. 1 is a block diagram showing an embodiment of the semiconductor memory according to the present invention.
Figure 6:
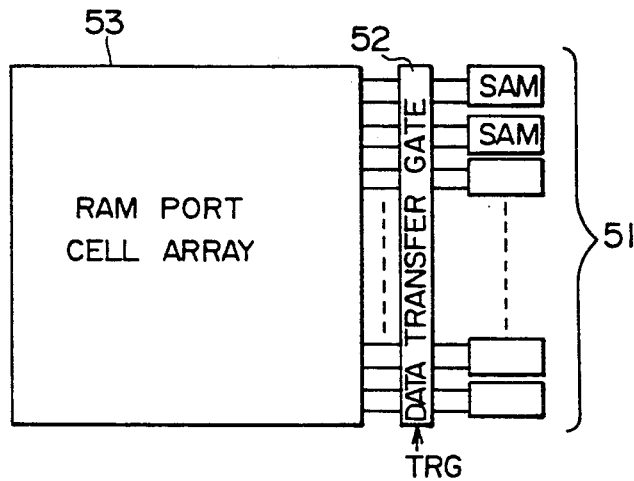
FIG. 6 is a block diagram showing a multiport memory to which an embodiment of the semiconductor memory according to the present invention can be applied.
Figure 7:
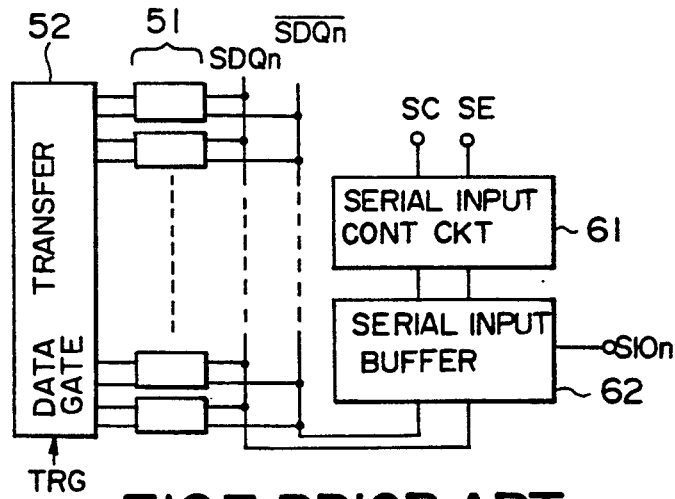
FIG. 7 is a block diagram showing a SAM port side of a prior-art multiport memory.

An embodiment of the present invention will be described hereinbelow with reference to the attached drawings. FIG. 1 is a block diagram showing the semiconductor memory of the invention. A row address strobe ($\overline{RAS}$) signal, a column address strobe ($\overline{CAS}$) signal, a write enable ($\overline{WE}$) signal, and a data transfer ($\overline{DT}$) signal are all inputted to a data transfer control circuit 11 as data transfer control signals. Further, a test logic control circuit 12 and an AND gate 13 are provided. At test, a high level $\overline{TE}$ signal is inputted to the test logic control circuit 12 from outside and an inverted test (STEST) signal is outputted therefrom. This STEST signal and a data transfer control (TRG') signal outputted from the data transfer control circuit 11 are inputted to the AND gate 13. An ANDed data transfer control (TRG) signal is outputted from the AND gate 13 and then inputted to the data transfer gate 52, shown in FIG. 6. In the prior art circuit, the data transfer control signal TRG is directly outputted from the data transfer control circuit 11 in response to a predetermined combination of the data transfer control signals, which is quite different from the circuit of the present invention.

Figure 2:
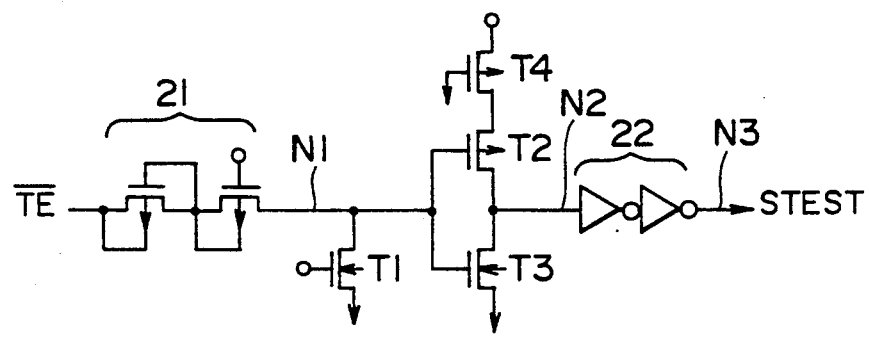
FIG. 2 is a circuit diagram showing a test logic control circuit of the memory.

FIG. 2 shows a more practical circuit of the test logic control circuit 12. The $\overline{TE}$ signal is inputted to an operation threshold regulating means 21 composed of two series-connected P channel transistors, and the output of the regulating means 21 is given to an input terminal N1 of an inverter composed of a P-channel transistor T2 and an N-channel transistor T3. A drain of an N channel transistor T1 is connected to the input terminal N1. This transistor T1 is kept turned off at test by applying a low level signal to the gate thereof. Further, a P channel transistor T4 is connected as a resistor between the source of the P channel transistor T2 and a voltage supply terminal.

The output terminal N2 of the inverter is connected to an amplifier 22 composed of two series-connected inverters, and the STEST signal is outputted from an output terminal N3 thereof. The test logic control circuit 12 configured as described above inverts the high-level $\overline{TE}$ signal to output a low-level STEST signal.

This low-level STEST signal is given to the AND gate 13, and a low-level TRG signal is outputted from the AND gate and then given to the data transfer gate 52 to close the gate thereof. Therefore, data stored in the SAM port can be read to outside (pseudo-read transfer), without transferring data from the RAM port to the SAM port. That is, in case the read data are erroneous, the erroneous operation is determined as that caused when data are read from the SAM port, so that it is possible to discriminate the erroneous operation caused when data are transferred from the RAM port to the SAM port from the above-mentioned erroneous operation, thus allowing the causes to be quickly identified.

Figure 3:
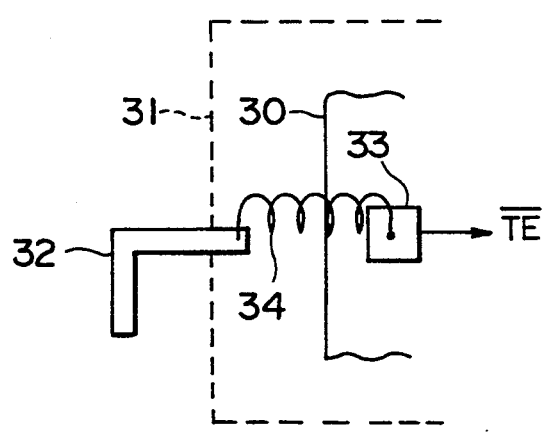
FIG. 3 is a circuit diagram for assistance in explaining a route through which a $\overline{TE}$ signal is inputted to the memory from outside.

Here, the $\overline{TE}$ signal is inputted from outside via a route as shown in FIG. 3. In more detail, a testing electrode 33 is formed at an internal portion of a semiconductor chip 30, and a lead 32 supported by a package 31 is provided for an external portion of the semiconductor chip 30. This lead 32 is a non-connection pin not connected to any other electrode, and connected to the electrode 33 via a bonding wire 34. At test, a voltage higher than the supply voltage Vcc is supplied to the lead 32 to allow the high-level TE signal to be inputted to the test logic control circuit 12 via the electrode 33.

In this embodiment, the TEST signal indicative of being tested is generated by applying the TE signal to the test logic control circuit 12 from outside. However, it is also possible to prescribe a signal indicative of being tested by preparing a new combination of conventional various operation signals, without supplying the TE signal from outside. FIG. 4 is a truth table of the operation signals prescribed by Joint Electron Device Engineering Council (JEDEC). In FIG. 4, it is also possible to prescribe the test when any one of the non-prescribed combination (1) and (2) is established.

Further, the circuit configuration for reading data stored in the SAM port to outside as explained in the above-mentioned embodiment is necessary only at the stage where operational failure is tested. Therefore, the circuit configuration is unnecessary at the stage where the memory is shipped. Therefore, it is indispensable to keep the STEST signal at low level. In this embodiment, the low level STEST signal is secured by supplying the supply voltage Vcc to the gate of the N channel transistor T1 of the test logic control circuit, shown in FIG. 2, to keep this transistor T1 turned on.

Figure 5:
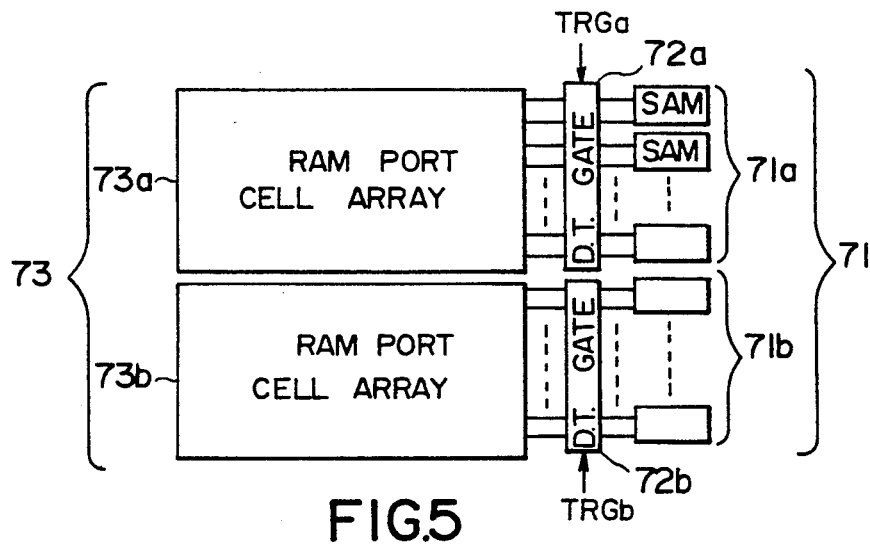
FIG. 5 is a block diagram showing another embodiment of the semiconductor memory according to the present invention.

The present invention can be modified in various ways. Another embodiment of the semiconductor memory will be explained with reference to FIG. 5, by way of example.

In this memory, the RAM port cell array 73 is divided into two cell arrays 73a and 73b, and similarly the SAM port data register 71 is divided into two data registers 71a and 71b. Data transfer between the cell array 73a and the data register 71a is controlled by a data transfer gate 72a, and data transfer between the cell array 73b and the data register 71b is controlled by another data transfer gate 72b. In this embodiment, since the RAM port and the SAM port are divided into two, respectively, split data transfer is enabled.

TRGa and TRGb signals are inputted to the data transfer gates 72a and 72b as a data transfer control signal, respectively. The TRGa signal is independent from the TRGb signal or vice versa. That is, two circuits shown in FIG. 1 are provided, and two signals of $\overline{TEa}$ and $\overline{TEb}$ are inputted to the circuit shown in FIG. 1, respectively to generate the TRGa signal or the TRGb independently. For instance, when data stored in one data register 71a are read to outside, only the data transfer gate 72a is closed to inhibit data from being transferred from the cell array 73a to the data register 71a, thus allowing the cause of erroneous operation to be quickly ascertained. Further, in this embodiment, the RAM port cell array and the SAM port data register can be divided into any given plural numbers, without being limited to only two.

As described above, in the present invention, when operational failure related to data transfer between the RAM port and the SAM port is tested, since a test signal is applied from the test signal generating means to the transfer gate to close the gate, it is possible to read data stored in the SAM port to the outside, without transferring data from the RAM port to the SAM port. Therefore, causes of erroneous operation can be easily specified and therefore failure analysis can be effectively achieved, thus attaining an improvement in turn-around time and a reduction in cost of the semiconductor memory.

What is claimed is:

1. A semiconductor memory, comprising:
    a random access memory port composed of memory cells arranged on a semiconductor chip in matrix fashion;
    a serial access memory port composed of serial data registers arranged on the same semiconductor chip in a column direction of said random access memory port;
    a data transfer gate provided between said random access memory port and the serial access memory port; and
    test signal generating means for generating a test signal to said data transfer gate to close the gate, when data stored in said serial access memory port are read to outside,
    whereby the data stored in the serial access memory port can be read to outside, without transferring data from said random access memory port to said serial access memory port.

2. The semiconductor memory of claim 1, which further comprises an electrode formed on the semiconductor chip and connected to said test signal generating means, and a lead connected to said electrode, said test signal generating means generating the test signal when a predetermined potential is supplied to the lead from outside.

3. The semiconductor memory of claim 1, wherein said test signal generating means generates the test signal at timing prescribed by a combination of plural signal levels not defined as ordinary operation modes of said semiconductor memory.

4. The semiconductor memory of claim 1, wherein said test signal generating means comprises means for inhibiting the test signal from being generated when said semiconductor memory is shipped.

5. The semiconductor memory of claim 1, wherein said random access memory port, said serial access memory port, and said data transfer gate are divided into a plurality of ports or gates, respectively, to enable split data transfer.

* * * * *